(12) United States Patent
Sheng-Fuh et al.

(10) Patent No.: US 7,340,237 B2
(45) Date of Patent: Mar. 4, 2008

(54) DUAL-BAND ACTIVE FILTER

(75) Inventors: Chang Sheng-Fuh, 3F No.2-1, Industry East Rd. 1, Science-Based Industrial Park, Hsinchu (TW); Chen Wen-Lin, Hsinchu (TW); Shiu Yu-Da, Hsinchu (TW); Chen Hung-Cheng, Hsinchu (TW); Tang Shu-Fen, Hsinchu (TW); Chen Albert, Hsinchu (TW)

(73) Assignees: Integrated System Solution Corp., Hsinchu (TW); Chang Sheng-Fuh, Hsinchu (TW)

(*) Notice: Subject to any disclaimer, the term of this patent is extended or adjusted under 35 U.S.C. 154(b) by 379 days.

(21) Appl. No.: 11/187,844

(22) Filed: Jul. 25, 2005

(65) Prior Publication Data

US 2007/0021088 A1 Jan. 25, 2007

(51) Int. Cl.
*H04B 1/26* (2006.01)
(52) U.S. Cl. .................. 455/307; 455/339; 327/552
(58) Field of Classification Search ............... None
See application file for complete search history.

(56) References Cited

U.S. PATENT DOCUMENTS

| 5,995,814 A | 11/1999 | Yeh ............... 455/180.1 |
| 7,245,186 B2* | 7/2007 | Chang et al. ......... 327/552 |
| 2005/0186935 A1* | 8/2005 | Kawama et al. ........ 455/339 |

OTHER PUBLICATIONS

Article entitled "An Original Topology of Dual-Band Filter with Transmission Zeros" by C. Quendo et al., 2003 IEEE MTT-S Digest, pp. 1093-1096.
Article entitled "Dual-Band Step-Impedance Bandpass Filter For Multimode Wireless LANs" by Sheng-Fuh Chang et al., published in Electronics Letters, Jan. 8, 2004, vol. 40, No. 1.

* cited by examiner

*Primary Examiner*—Thanh Cong Le
(74) *Attorney, Agent, or Firm*—Pillsbury Winthrop Shaw Pittman, LLP (57) ABSTRACT

The present invention discloses a dual-band active filter having filtering response and positive pass-band gain. The dual-band active filter includes an input match unit for gain match of the dual-band active filter and for having a bandpass filtering response; a first gain stage electrically connected to the first input match unit for providing the flat gain of the dual-band active filter; an inter-stage unit electrically connected to the first gain stage for matching gain and for having a band-stop filter response; a second gain stage electrically connected to the inter stage unit for providing the flat gain of the dual-band active filter; and an output unit electrically connected to the second gain stage for matching the dual-band active filter and for having a low-pass filtering response. The dual-band active filter according to the present invention uses the cascade connection of multiple filter stages to have band-pass filtering response at two different frequency bands and obtain high stop-band attenuation by providing plural transmission zeros in the stop-band.

19 Claims, 9 Drawing Sheets

DUAL-BAND ACTIVE FILTER

BACKGROUND OF THE INVENTION

1. Field of the Invention

The present invention generally relates to a microwave circuit, and more particularly to a dual-band active filter having positive gain and bandpass spectral performance for microwave and millimeter-wave wireless communication systems.

2. Description of the Related Art

The rapid development of the coexisted operation of multi-standard wireless and mobile communication has been driving conventional RF and baseband transceivers to have integrated multi-band and multi-functional characteristics, such as the multimode wireless LAN IEEE802.11a/b/g PCMCIA card, the integrated Bluetooth/WLAN card, and the integrated GSM/WLAN handset. This requirement has driven the conventional single-band RF circuits, such as the low-noise amplifier (LNA), bandpass filters (BPF), mixers, voltage-controlled oscillators (VCOs) and the power amplifier (PA), to a new design era. Moreover, the fast developing radio-on-a-chip circuit contains the monolithic active chips, but still needs off-chip passive filters to achieve maximum performance and lowest cost. But the off-chip passive filters, conventionally implemented by waveguide or planar structures on ceramic substrates, are bulky or inherently lossy that they are difficult in achieving true single-chip implementation. A variety of conventional active filter design methods offer good solution of this difficulty, but they are limited to single-band operation.

To achieve dual-band or multi-band operation, the paper, reported by Quend et al entitled "An original topology of dual-band filter with transmission zeros," *IEEE MTT-S Technical Digest* 2003, vol. 2, pp. 1093-1096, provided a dual-band design based on the parallel combination of multiple dual-behavior resonators. Another approach proposed by the inventor and co-workers employs the step-impedance resonator to obtain dual passbands with high stop-band suppression, as detailed in *Electronics Letters*, vol. 50, pp. 38-39, 2004. Although these methods achieve good dual-band filter performance, they belong to a passive structure due to their use of microstrip line structures. They provide no signal gain and, in reality, they have loss due to the substrate and conductor losses.

U.S. Pat. No. 5,995,814 issued to James Yeh., entitled "Single-stage dual-band low-noise amplifier for use in a wireless communication system receiver", discloses that a low-noise amplifier capable of operating in two frequency bands for Personal Communication Services (PCS) receiver or other wireless communication system terminals. An exemplary embodiment of the amplifier includes a single bipolar-junction-transistor amplification stage, where the input and output matching networks for each transistor include a first series capacitor, a shunt inductor coupled to ground potential, a second series capacitor and a second inductor coupled to a supply voltage. These four elements are used to provide narrowband input or output matches in two distinct frequency bands, such as 900 MHz and 1.8 GHz. The matching networks can be realized by using only lumped inductive and capacitive elements. The amplifier may be configured to provide a minimum gain of 15 dB and a maximum noise figure of 2 dB over 100 MHz-wide bands centered at 900 MHz and 1.8 GHz. Although this dual-band LNA provides dual-band gain, it suffers poor stop-band suppression. Thus it needs to connect with extra passive filters to have strong out-of-band interference suppression.

According to the above problems, there is a need to provide a dual-band active filter having the positive gain and filter performance to overcome the conventional disadvantages.

BRIEF SUMMARY OF THE INVENTION

It is an objective of the present invention to provide a dual-band active filter, having bandpass filter performance and transmission zeros in the stopband to obtain high stop-band rejection level.

It is another objective of the present invention to provide a dual-band active filter fabricated on the silicon substrate for use in the microwave to millimeter-wave range without degrading the circuit gain and without increasing the chip size.

To achieve the above and other objectives, the present invention provides a dual-band active filter having the bandpass filtering response and positive passband gain. The dual-band active filter comprises an input match unit, a first gain stage electrically connected to the first input match unit, a first inter-stage unit electrically connected to the first gain stage, a second gain stage electrically connected to the first inter-stage unit and an output unit electrically connected to the second gain stage.

The input match unit is used for gain match of the dual-band active filter and having a band-pass filter response. The first gain stage is used for providing the flat gain of the dual-band active filter. The first inter-stage unit is used for matching gain and having a band-stop filter response. The second gain stage is used for providing the flat gain of the dual-band active filter and the output unit is used for matching the dual-band active filter and having a low pass filtering response.

According to one aspect of the dual-band active filter of the present invention, the input match unit is constructed from a first L network and a second L network comprising the inductors and capacitors, resulting for gain match of the dual-band active filter and for having a high pass filter response.

According to one aspect of the dual-band active filter of the present invention, the input match unit is constructed from a third L network comprising the inductors and capacitors, resulting for gain match of the dual-band active filter and having a bandpass filter response.

According to one aspect of the dual-band active filter of the present invention, the output match unit is constructed from a fourth L network and a fifth L network comprising the inductors and capacitors, resulting for gain match of the dual-band active filter and for having a low pass filter response.

According to one aspect of the dual-band active filter of the present invention, the first inter-stage unit is a sixth L network comprising the inductors and capacitors, resulting for driving the gain of the dual-band active filter and for having a bandstop filter response.

The advantage of the dual-band active filter of the present invention is that the match units have filtering performances and the filter responses can be precisely predicted.

Another advantage of the dual-band active filter of the present invention is the transmission zeros can be designed at the desired frequencies to enhance the interference rejection level.

BRIEF DESCRIPTION OF THE DRAWINGS

All the objects, advantages, and novel features of the invention will become more apparent from the following detailed descriptions when taken in conjunction with the accompanying drawings.

DETAILED DESCRIPTION OF THE INVENTION

Although the invention has been explained in relation to several preferred embodiments, the accompanying drawings and the following detailed descriptions are the preferred embodiment of the present invention. It is to be understood that the following disclosed descriptions will be examples of present invention, and will not limit the present invention into the drawings and the special embodiment.

In past, the RF passive filter is constructed from the combination of the inductors, capacitors, resistors, and the transmission line. The RF passive filter is a lossy device, which has a power gain lower than 0 dB. To have positive gain, the RF passive filter is usually cascaded with gain amplifiers.

Figure 1:
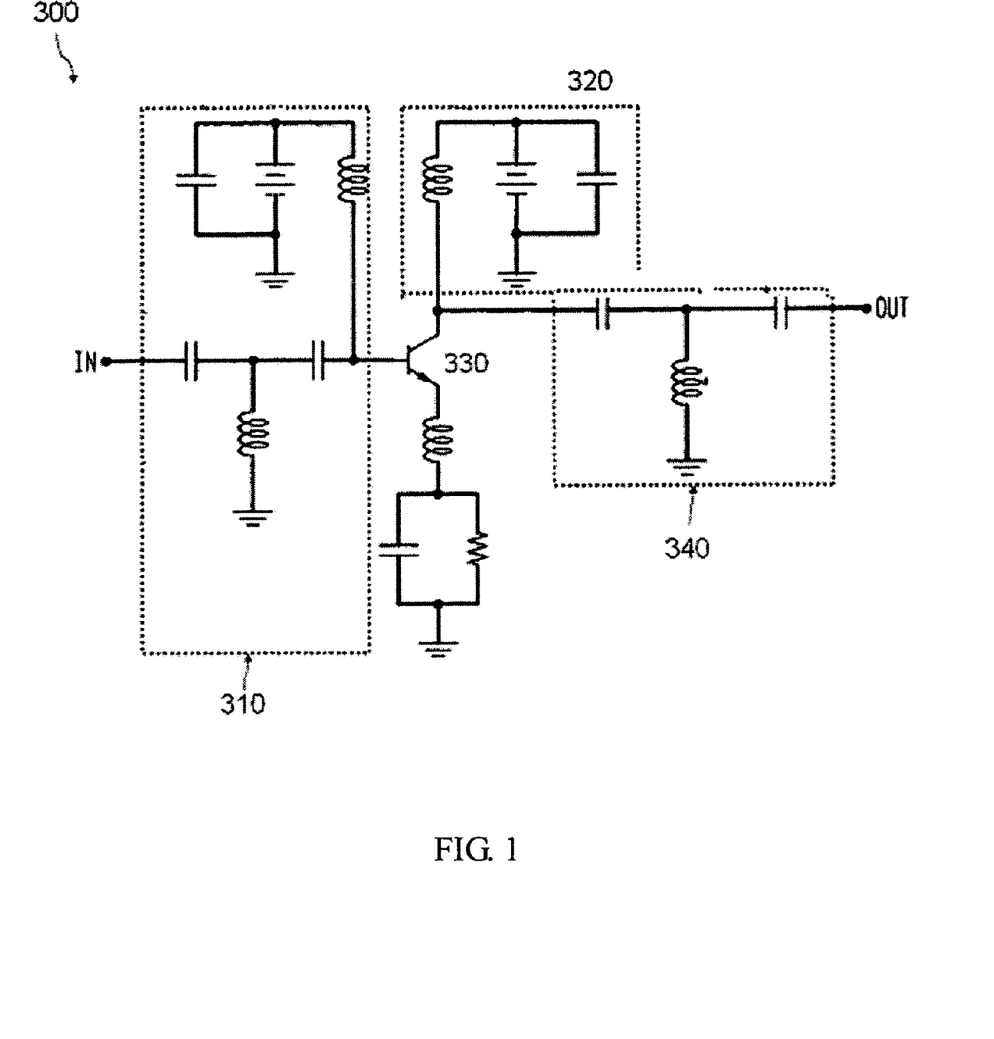
FIG. 1 shows the schematic diagram of a conventional single-stage active amplifier of prior art.

To understand the spirit of the present invention, the conventional single-stage amplifier of prior art is introduced first. Referring to FIG. 1, it shows a schematic of a conventional single-stage amplifier. The amplifier 300 mainly comprises an input match unit 310, a bias unit 320, a gain stage 330, and an output match unit 340. The input match unit 310 and the output match unit 340 are used to achieve gain match of the gain stage 330, and are realized with the transmission line, where the design parameters of the transmission line can be calculated from the Smith chart. The bias unit 320 is used to drive the amplifier 300 into a proper bias condition, and a capacitor in the bias unit 320 is used for DC blocking and an inductor is used for RF chocking.

Figure 2:
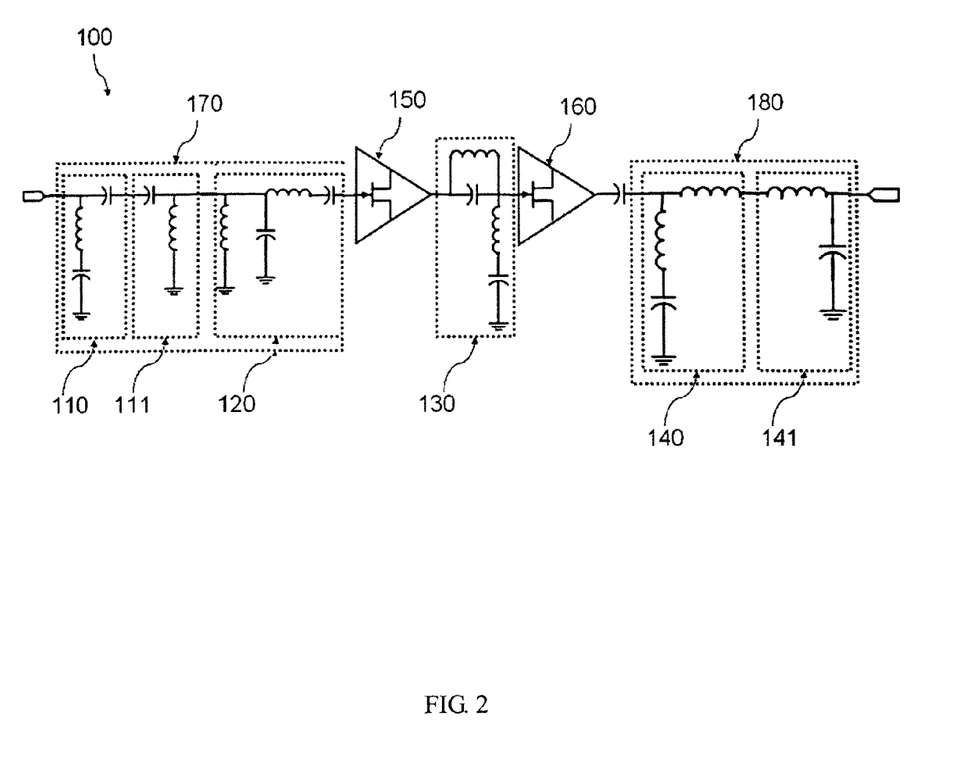
FIG. 2 shows the schematic diagram of a dual-band active filter according to the first embodiment of the present invention.

Now referring to FIG. 2, it shows a schematic of a dual-band active filter according to the first embodiment of the present invention. The dual-band active filter 100 comprises an input match unit 170, a first gain stage 150 electrically connected to the first input match unit 170, a first inter-stage unit 130 electrically connected to the first gain stage 150, a second gain stage 160 electrically connected to the first inter stage unit 130 and an output unit 180 electrically connected to the second gain stage 160. As shown in the FIG. 2, the input port of the dual-band active filter is in front of the input match unit 170 and the output port of the dual-band active filter follows the output match unit 180.

The input match unit 170 is used for gain match of the dual-band active filter 100 and for having a first filter characteristic, preferably a band-pass filter response. The first gain stage 150 is used for providing the flat gain of the dual-band active filter 100. The first inter-stage unit 130 is used for matching gain and for having a second filter characteristic, preferably a band-stop filter response. The second gain stage 160 is used for providing the flat gain of the dual-band active filter 100 and the output unit 180 is used for matching the dual-band active filter 100 and for having a third filter characteristic, preferably a low-pass filtering response. Therefore the dual-band active filter 100 becomes a filter chain, composed of multiple cascaded filter cells with different frequency selective responses. Therefore, a resultant dual-band spectral response can be obtained. The image-parameter filter method according to G. L. Matthaei et al, "Microwave Filters, Impedance-Matching Networks and Coupling Structures", N.Y., McGraw Hill, 1980, is applied to determine the element values of the input match unit 170, the inter-stage unit 130 and the output match unit 180. The image-parameter method has advantages of simplifying a high-order filter design as a cascade of multiple elementary filter cells so that the resultant performance is obtained simply by the combination of each filter cell frequency response.

Figure 3:
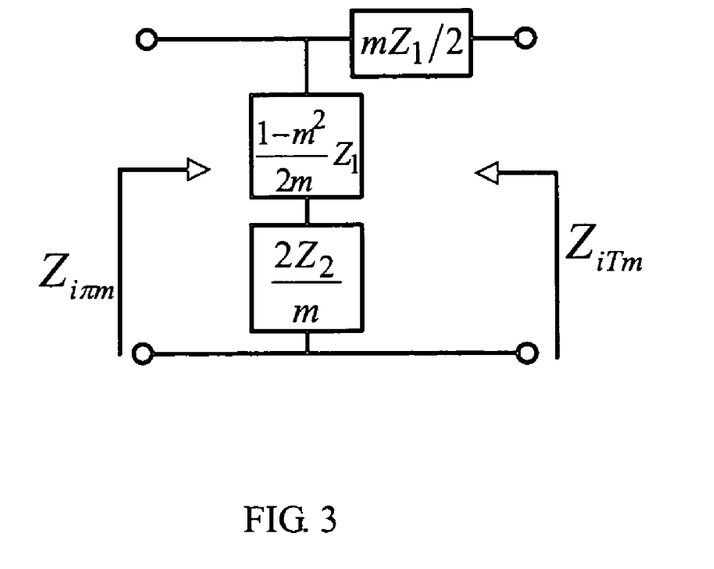
FIG. 3 shows the equivalent circuit of the first L network 110 of the input match unit and the equivalent circuit of the fourth L network 140 of the output match unit in FIG. 2 according to the first embodiment of the present invention.

The input match unit 170 is constructed from a first L network 110 (high-pass), a second L network 111 (high-pass) and a third L network 120 (band-pass). The values of the inductors and capacitors of the input match unit 170 are accurately designed to match the source reference impedance of the dual-band active filter 100 and also to generate a high-pass response and another bandpass response. Now referring to the FIG. 3, it shows the equivalent circuit of the first L network 110 of the input match unit 170 in FIG. 2 according to the first embodiment of the present invention. The first L network 110 belongs to a high-pass m-derived L-type network based on the image parameter method. The first image impedance $Z_{iTm}$, $Z_{i\pi m}$ are given by the equation:

$$Z_{iTm} = \frac{1+(1-m^2)\frac{Z_1}{4Z_2}}{\sqrt{1+\frac{Z_1}{4Z_2}}}\sqrt{Z_1 Z_2} = \frac{1-(1-m^2)\frac{\omega_c^2}{\omega^2}}{\sqrt{1-\frac{\omega_c^2}{\omega^2}}} R_o \quad (1)$$

-continued $$Z_{i\pi m} = \frac{\sqrt{1 + \frac{Z_1}{4Z_2}}}{1 + (1-m^2)\frac{Z_1}{4Z_2}} \sqrt{Z_1 Z_2} = \frac{\sqrt{1 - \frac{\omega_c^2}{\omega^2}}}{1 - (1-m^2)\frac{\omega_c^2}{\omega^2}} R_o \quad (2)$$

where $Z_1 = 1/j\omega C$, $Z_2 = j\omega L$, the angular cutoff frequency $$\omega_c = \frac{1}{2\sqrt{LC}},$$

and the image impedance at DC $$R_o = \sqrt{\frac{L}{C}}.$$

The inductance L and the capacitance C in the first L network 110 can be determined by its high-pass cutoff frequency $$f_c = \frac{\omega_c}{2\pi}$$

and a first image impedance $Z_{iTm}$ and $Z_{i\pi m}$ of the first L network 110.

Figure 4:
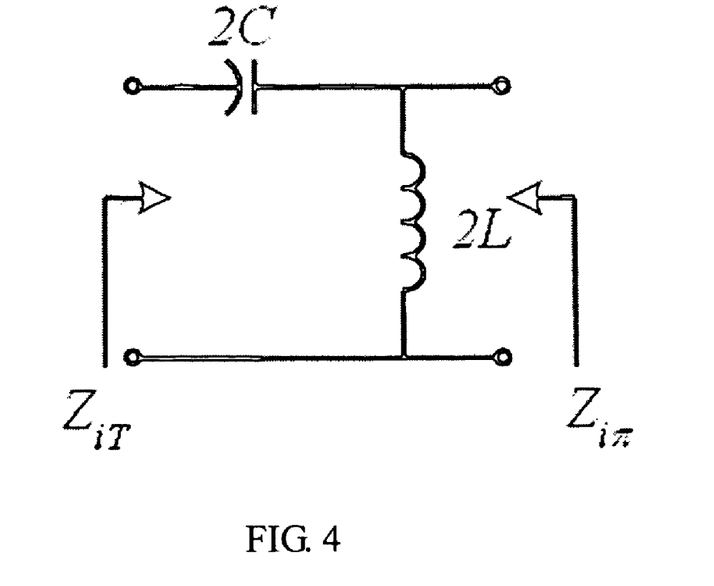
FIG. 4 shows the circuit of the second L network 111 of the input match unit in FIG. 2 according to the first embodiment of the present invention.

Now referring to the FIG. 4, it shows the second L network 111 of the input match unit 170 in FIG. 2 according to the first embodiment of the present invention. The second L network 111 is a high-pass constant-k L-type network based on the image parameter method. The second image impedances $Z_{iT}$, $Z_{i\pi}$ are given by the equation:

$$Z_{iT} = R_0 \sqrt{1 - \left(\frac{\omega_c}{\omega}\right)^2} \quad (3)$$

$$Z_{i\pi} = \frac{R_0}{\sqrt{1 - \left(\frac{\omega_c}{\omega}\right)^2}} \quad (4)$$

where the angular cutoff frequency is $$\omega_c = \frac{1}{2\sqrt{LC}}$$

and the image impedance at DC is $$R_0 = \sqrt{\frac{L}{C}}.$$

And the inductance of the inductors and the capacitance of the capacitors in the second L network 111 are determined by the cutoff frequency, and the second image impedances $Z_{iT}$ and $Z_{i\pi}$ of the second L network 111. The image impedances of the constants prototype L-type network strongly vary with frequency and, in contrast, the m-derived L-type network has almost constant image impedances by the proper value of m. When m equals 0.6, the image impedance have the smallest variation with frequency, which is preferable in design. Additionally, the high-pass m-derived L-type network has one transmission zero, determined by the shunt branch of $f_{zero} = f_c\sqrt{1-m^2}$.

Figure 5:
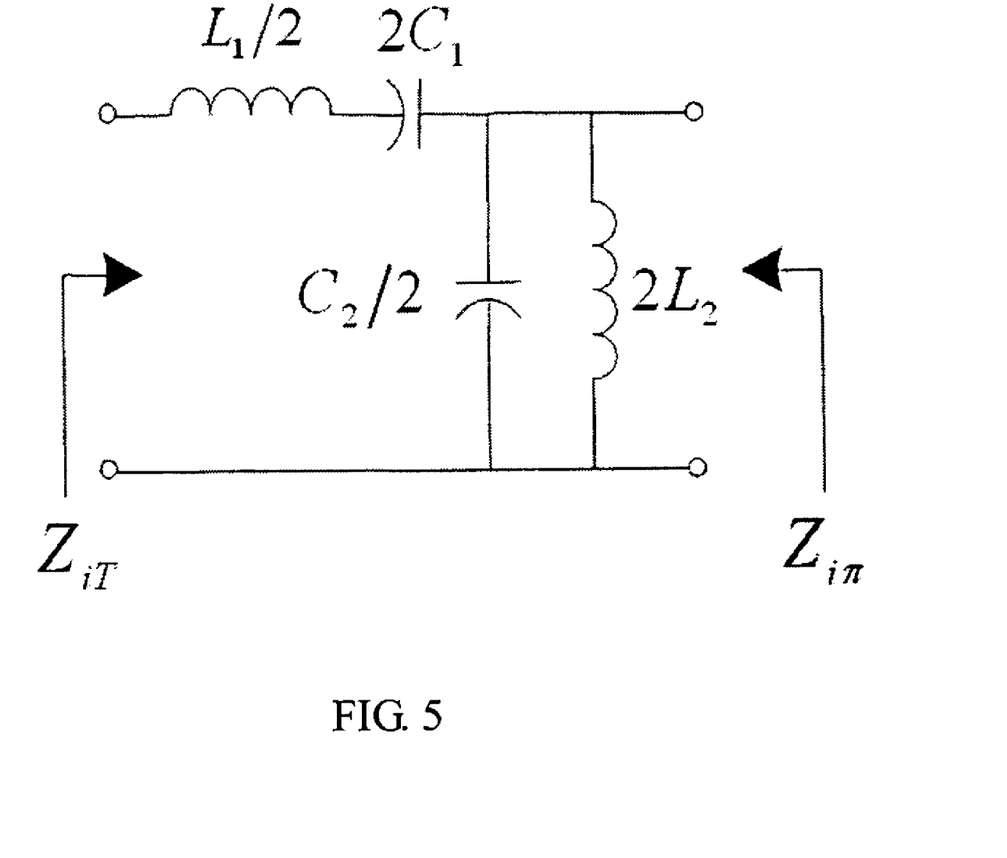
FIG. 5 shows the circuit of the third L network 120 of the input match unit in FIG. 2 according to the first embodiment of the present invention.

The third L network 120 is a band-pass L-type network comprising the inductors and capacitors. The third image impedances of the third L network 120 matches the input and output impedance of the third L network 120. Now referring to the FIG. 5, it shows the circuit of the third L network 120 of the input match unit 170 in FIG. 2 according to the first embodiment of the present invention. The third L network 120 is a band-pass constant-k L-type network based on the image parameter method. Assuming the angular cutoff frequencies of the third L network 120 are $\omega_1$ and $\omega_2$, the third image impedances $Z_{iT}$, $Z_{i\pi}$ are given by the equation:

$$Z_{iT} = R_0 \sqrt{1 - \left[\frac{\left(\frac{\omega}{\omega_m} - \frac{\omega_m}{\omega}\right)}{\left(\frac{\omega_2}{\omega_m} - \frac{\omega_m}{\omega_2}\right)}\right]^2} \quad (5)$$

$$Z_{i\pi} = \frac{R_0}{\sqrt{1 - \left[\frac{\left(\frac{\omega}{\omega_m} - \frac{\omega_m}{\omega}\right)}{\left(\frac{\omega_2}{\omega_m} - \frac{\omega_m}{\omega_2}\right)}\right]^2}} \quad (6)$$

where $f_m = \sqrt{f_1 f_2}$, $f_1$ and $f_2$ are the cutoff frequencies, $f_1 = \omega_1/2\pi$ and $f_2 = \omega_2/2\pi$. And the inductance of the inductors and the capacitance of the capacitors in the third L network 120 are determined by the cutoff frequencies $f_1$ and $f_2$ and the third image impedances $Z_{iT}$ and $Z_{i\pi}$ of the third L network.

The output match unit 180 is constructed from a fourth L network 140 (low-pass) and a fifth L network 141 (low-pass), comprising the inductors and capacitors. The values of the inductors and capacitors of the output match unit 180 are suitably designed to match the input impedance of the dual-band active filter 100 and generate a low pass response. The inductance of the inductors and the capacitance of the capacitors in the fourth L network 140 are determined by its cutoff frequency and a fourth image impedance $Z_{iTm}$ and $Z_{i\pi m}$ of the fourth L network 140. The fourth image impedance of the fourth L network 140 matches the input and output impedance of the fourth L network 140 to minimize pass-band gain ripple of dual-band active filter 100. Now referring to the FIG. 3, it shows the equivalent circuit of the fourth L network 140 of the output match unit 180 in FIG. 2 according to the first embodiment of the present invention. The fourth L network 140 is a low-pass m-derived L-type network based on the image parameter method. The fourth image impedances $Z_{iTm}$, $Z_{i\pi m}$ are given by the equation:

$$Z_{iTm} = \frac{1 - (1-m^2)\frac{\omega^2}{\omega_c^2}}{\sqrt{1 - \frac{\omega^2}{\omega_c^2}}} R \quad (7)$$

-continued $$Z_{i\pi m} = \frac{\sqrt{1 - \frac{\omega^2}{\omega_c^2}}}{1 - (1-m^2)\frac{\omega^2}{\omega_c^2}} R \quad (8)$$

where the angular cutoff frequency $$\omega_c = \frac{2}{\sqrt{LC}} \text{ and } R = \sqrt{\frac{L}{C}}.$$

And the inductance of the inductors and the capacitance of the capacitors in the fourth L network 140 can be determined by the cutoff frequency and the fourth image impedances $Z_{iTm}$ and $Z_{i\pi m}$ of the fourth L network.

Figure 6:
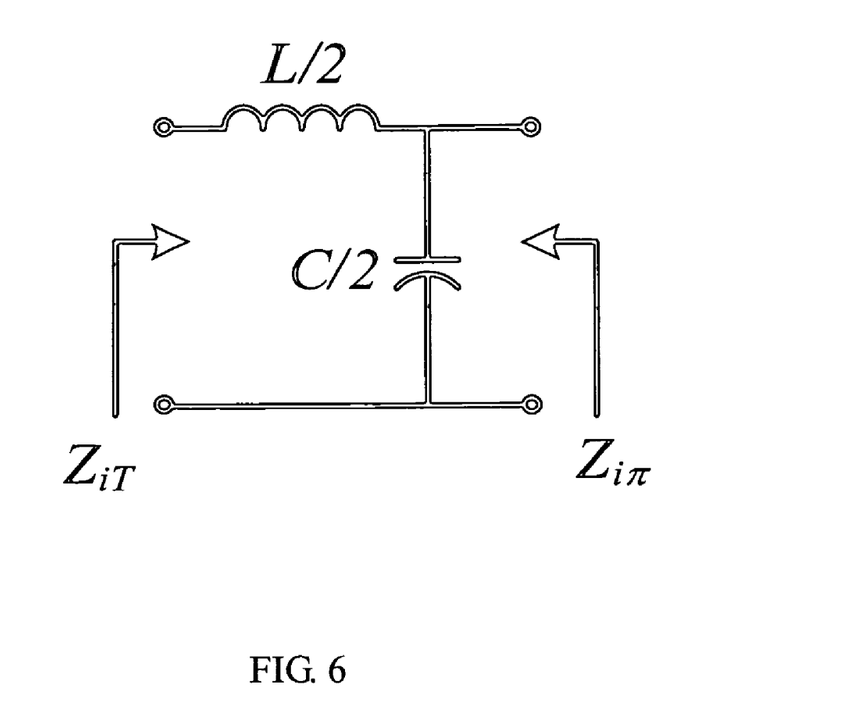
FIG. 6 shows the circuit of the fifth L network 141 of the output match unit in FIG. 2 according to the first embodiment of the present invention.

Now referring to the FIG. 6, it shows the circuit of the fifth L network 141 of the output match unit 180 in FIG. 2 according to the first embodiment of the present invention. The fifth L network 141 is a low-pass constant-k L-type network based on the image parameter method. The fifth image impedance $Z_{iT}$ and $Z_{i\pi}$ are given by the equation:

$$Z_{iT} = R_0 \sqrt{1 - \left(\frac{\omega}{\omega_c}\right)^2} \quad (9)$$

$$Z_{i\pi} = \frac{R_0}{\sqrt{1 - \left(\frac{\omega}{\omega_c}\right)^2}} \quad (10)$$

where the angular cutoff frequency is $$\omega_c = \frac{2}{\sqrt{LC}},$$

and the image impedance at DC is $$R_0 = \sqrt{\frac{L}{C}}.$$

And the inductance of the inductors and the capacitance of the capacitors in the fifth L network 141 are determined by the cutoff frequency of the low-pass filter response, and the fourth image impedances $Z_{iT}$ and $Z_{i\pi}$ of the fifth L network. Similar to its counterpart of high-pass constant-k network, the low-pass constant-k L-type network has strong image-impedance variation with respect to frequency. In contrast, the low-pass m-derived L-type network with m=0.6 has minimized impedance variation, which is preferable in design. Additionally, the low-pass m-derived L-type network has one transmission zero, determined by the shunt branch of $f_{zero} = f_c/\sqrt{1-m^2}$.

Figure 7:
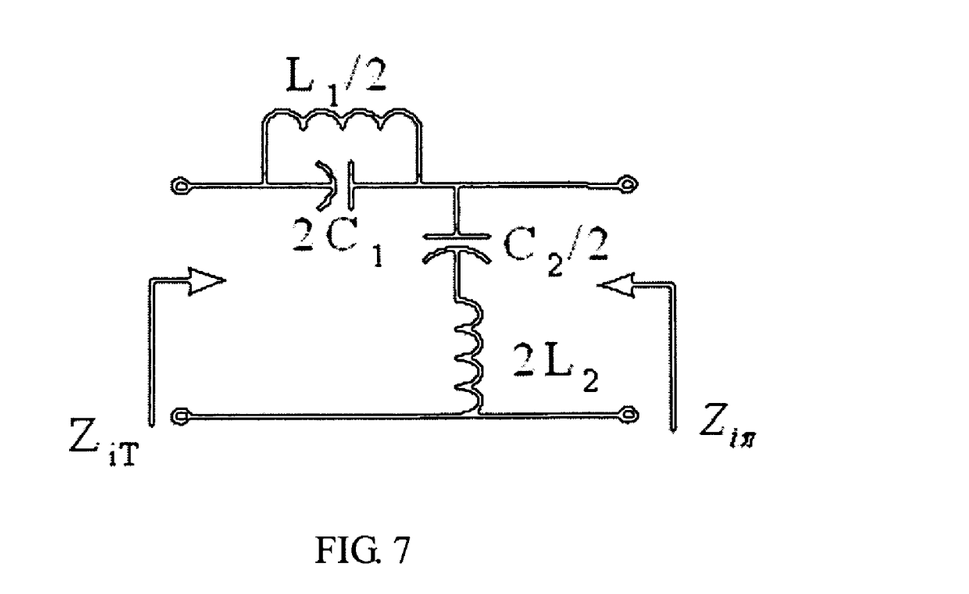
FIG. 7 shows the equivalent circuit of the first inter-stage unit 130 in FIG. 2 according to the first embodiment of the present invention.

Now referring to the FIG. 7, it shows the circuit of the sixth L network of the inter-stage match unit 130 in FIG. 2 according to the first embodiment of the present invention. The inter-stage unit 130 is constructed from a sixth L network, comprising the inductors and capacitors, resulting for matching the first gain stage 150 and the second gain stage 160, and for generating a bandstop response. The sixth L network is a band-stop constant-k L-type network based on the image parameter method. The sixth image impedances $Z_{iTm}$ and $Z_{i\pi m}$ are given by the equation:

$$Z_{iT} = R_0 \sqrt{1 - \left[\frac{\left(\frac{f_\infty}{f_1} - \frac{f_1}{f_\infty}\right)}{\left(\frac{f_\infty}{f} - \frac{f}{f_\infty}\right)}\right]^2} = R_0 \sqrt{1 - \left[\frac{\left(\frac{f_\infty}{f_2} - \frac{f_2}{f_\infty}\right)}{\left(\frac{f_\infty}{f} - \frac{f}{f_\infty}\right)}\right]^2} \quad (11)$$

$$Z_{i\pi} = \frac{R_0}{\sqrt{1 - \left[\frac{\left(\frac{f_\infty}{f_1} - \frac{f_1}{f_\infty}\right)}{\left(\frac{f_\infty}{f} - \frac{f}{f_\infty}\right)}\right]^2}} = \frac{R_0}{\sqrt{1 - \left[\frac{\left(\frac{f_\infty}{f_2} - \frac{f_2}{f_\infty}\right)}{\left(\frac{f_\infty}{f} - \frac{f}{f_\infty}\right)}\right]^2}} \quad (12)$$

where $R_0 = \sqrt{Z_1 Z_2}$, $f_\infty = \sqrt{f_1 f_2}$. The sixth image impedance of the sixth L network matches the input and output impedance of the sixth L network. The inductance of the inductors and the capacitance of the capacitors in the sixth L network are determined by the cutoff frequencies $f_1$ and $f_2$ of the band-stop filter response, and the sixth image impedances $Z_{iTm}$ and $Z_{i\pi m}$ of the sixth L network.

The first gain stage 150 and the second gain stage 160 are designed such that it offers flat gain over the desired pass-band range. The types of the gain stage which can be implemented with bipolar junction transistor (BJT), heterojunction bipolar transistor (HBT), high electronic mobility transistor (HEMT), pseudomorphic HEMT (PHEMT), complementary metal oxide semiconductor filed effect transistor (CMOS) and laterally diffused metal oxide semiconductor filed effect transistor (LDMOS). Semiconductor materials broadly applicable to the dual-band active filter 100 include silicon, silicon-on-insulator (SOI), silicon-germanium (SiGe), gallium arsenide (GaAs), indium phosphide (InP) and silicon-germanium-carbon (SiGe—C). Preferably, the first gain stage 150 and the second gain stage 160 are designed with resistive shunt-feedback PHEMT transistors on semiconductor substrate of Al—In—GaAs compound. Depending on the required gain value and return loss, the first gain stage 150 and the second gain stage 160 can be either single stage or multiple stages. By combining the band-pass response of the input match unit 170, the flat gain of the first gain stage 150, the band-stop response of the inter-stage unit 130, the flat gain of the second gain stage 160 and the low pass response of the output match unit 180, the dual-band active filter of the present invention has the positive gain at two desired pass-bands.

Figure 8:
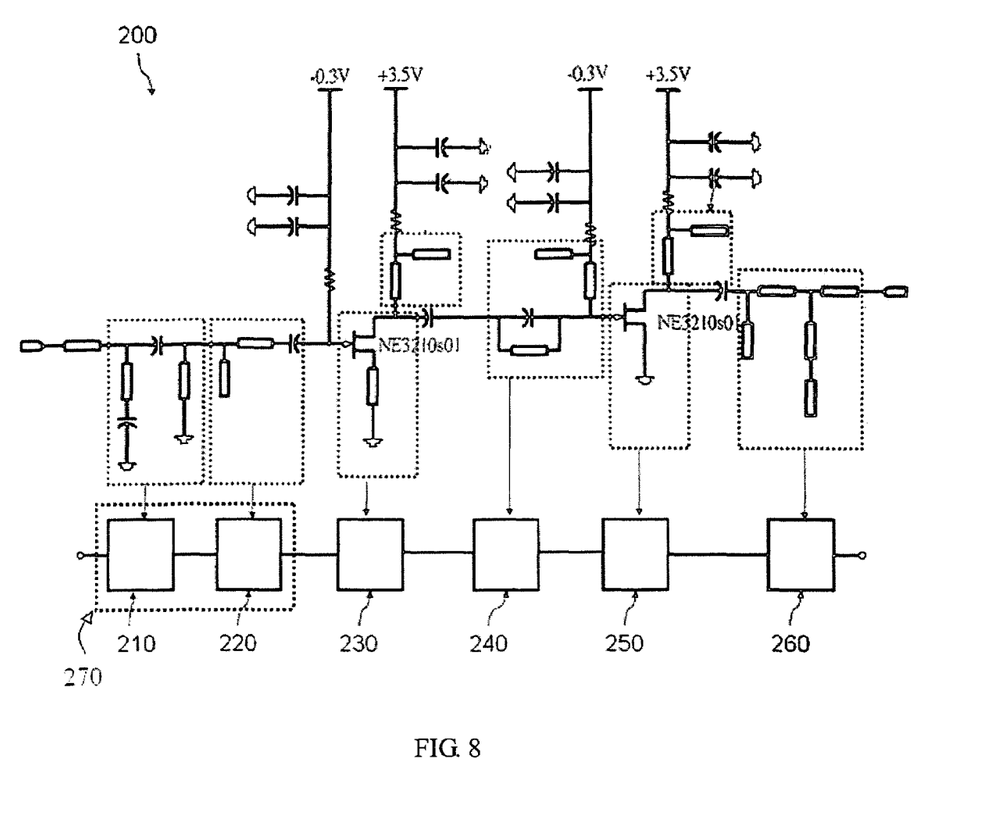
FIG. 8 shows the schematic diagram of a dual-band active filter according to the second embodiment of the present invention.

Now referring to FIG. 8, it shows a schematic of a dual-band active filter according to the second embodiment of the present invention. The dual-band active filter 200 comprises an input match unit 270, a first inter-stage unit 240, a first gain stage 230, a second gain stage 250, and an output match unit 260, which are similar to the input match unit 170, a first inter-stage unit 130, a first gain stage 150, a second gain stage 160, and an output match unit 180 in the FIG. 2, respectively. The main difference between the first embodiment and the second embodiment is the circuit implementations, namely, all lumped elements used in the first embodiment while the distributed elements such as transmission lines used in the second embodiment.

For MMIC realization, the lumped inductor is usually realized with a high-impedance short microstrip line, $\theta=2\tan^{-1}(\omega L Z_h)$, and the lumped capacitor is usually replaced with a radial open stub, wherein $\theta$ is the electric length of the microstrip line, $Z_h$ denotes for the characteristic impedance of the high-impedance microstrip line. The inductor can also be realized in the lumped type, for example, the spiral inductor and the lumped capacitor can be realized in the lumped type, for example, the interdigital capacitor or metal-insulator-metal insulator (MIM) capacitor. Furthermore, the layout parasitic such as microstrip T-junctions, bends, and via-holes are considered. The whole circuit is then optimized to achieve required passband gain and stopband attenuation. Then, a two-stage bandpass amplifier according to the invention is implemented.

Figure 9:
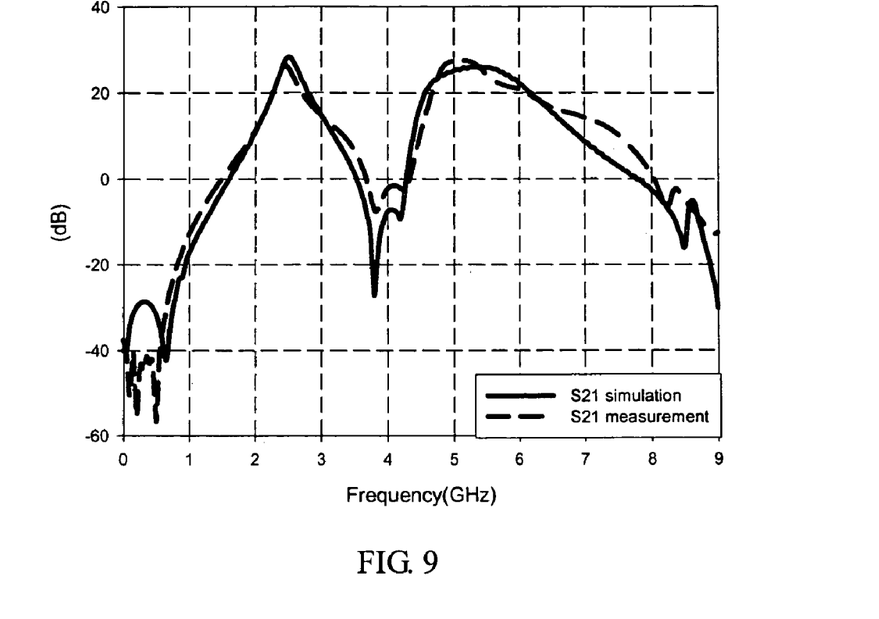
FIG. 9 shows the simulated and measured power gain performance of a dual-band active filter according to the second embodiment of the present invention.
Figure 10:
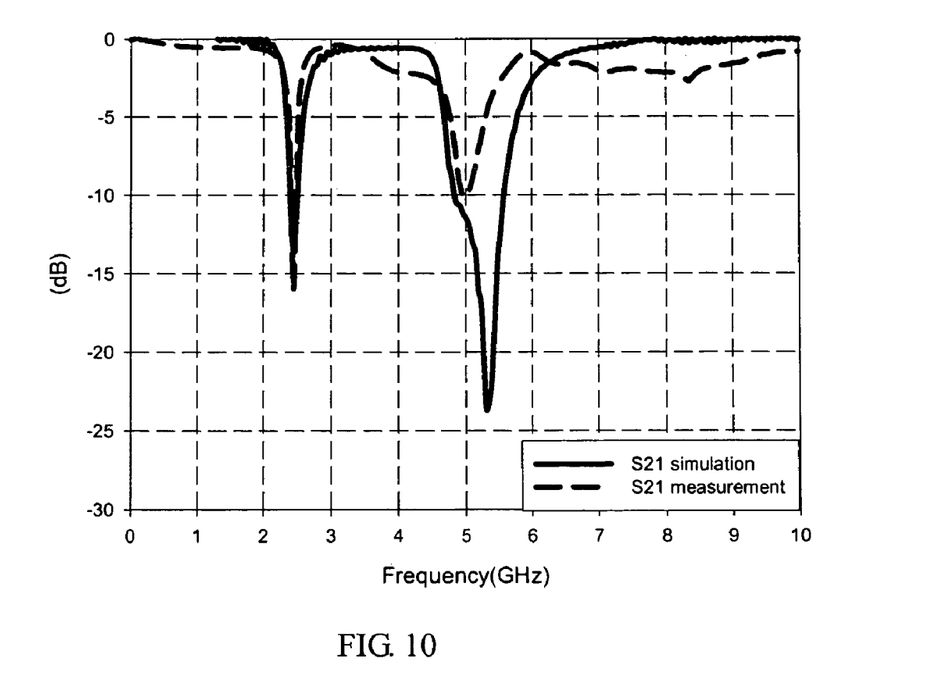
FIG. 10 shows the simulated and measured input return loss of the dual-band active filter according to the second embodiment of the present invention.
Figure 11:
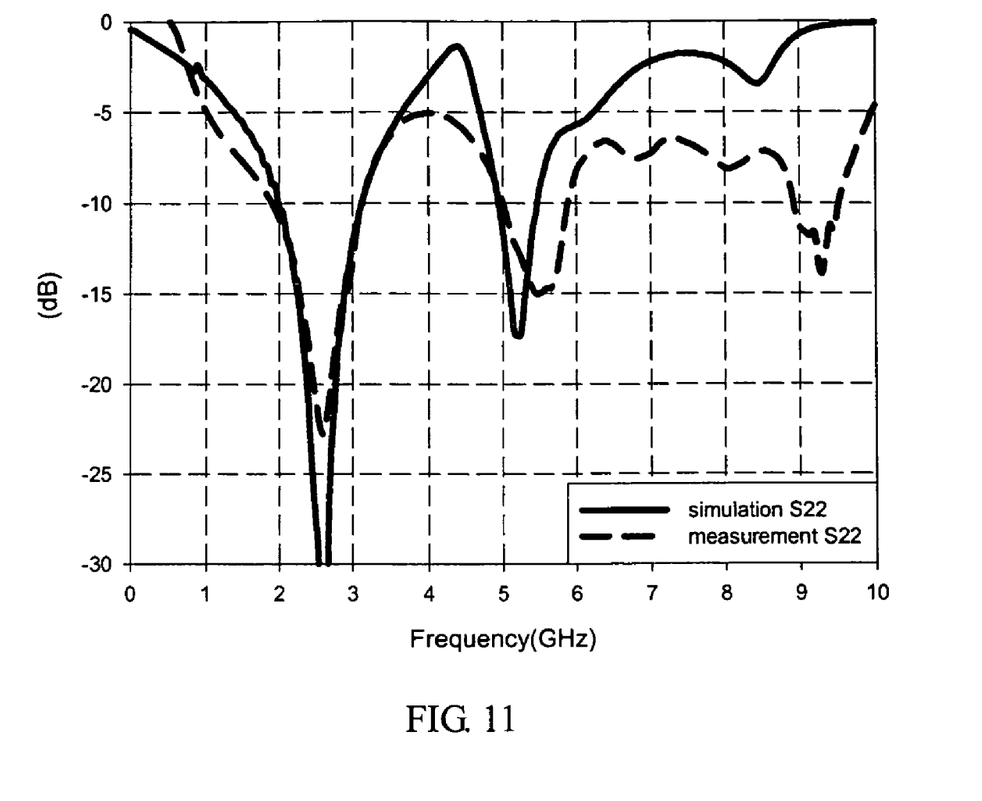
FIG. 11 shows the simulated and measured output return loss performance of the dual-band active filter according to the second embodiment of the present invention.

Now referring to FIG. 9, FIG. 10 and FIG. 11, they show the simulated and measured power gain (insertion loss), input return loss and output return loss performance of the dual-band active filter according to the second embodiment of the present invention, respectively. The simulated results show good dual-bandpass performance that the first passband gain is 26.6±1.2 dB and return loss is 7.8±0.4 dB from 2.4 to 2.483 GHz and the second pass-band gain is 26.1±0.2 dB and the return loss is 12.4±0.1 dB from 5.1 to 5.35 GHz. The simulated results show that the lower-side stop-band attenuation is 50-dBc below 500 MHz, 52-dBc attenuation level is obtained at 3.9 GHz between the two passband, and higher-side stop-band attenuation is 31-dBc above 8.5 GHz. The measured results show good dual-bandpass performance that the first passband gain is 25.5±0.4 dB and return loss is 8.2±0.2 dB from 2.4 to 2.483 GHz and the second passband gain is 27.1±0.5 dB and the return loss is 11.2±0.3 dB from 5.1 to 5.35 GHz. The measured results show that the lower-side stop-band attenuation is 57-dBc below 500 MHz, 32-dBc attenuation level is obtained at 3.9 GHz between the two passband, and higher-side stop-band attenuation is 52-dBc above 8.5 GHz. The practical measured return losses show the same trend with the simulated results.

Figure 12:
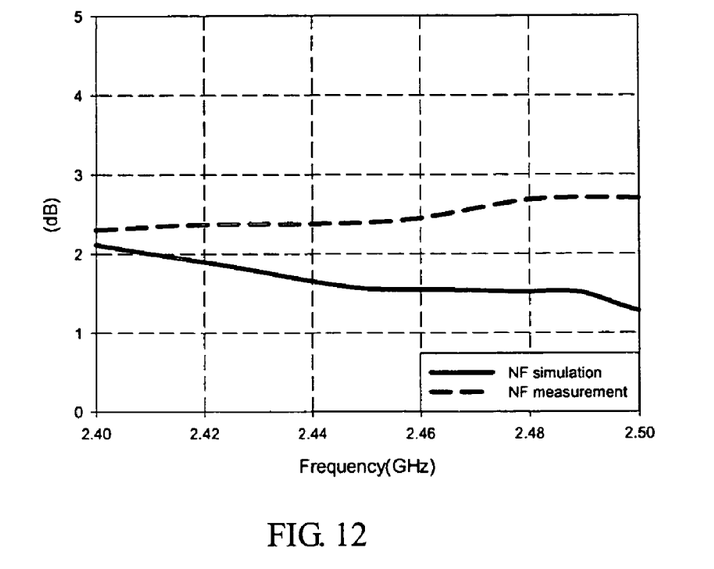
FIG. 12 shows the simulated and measured noise figure of the first passband of the dual-band active filter according to the second embodiment of the present invention.
Figure 13:
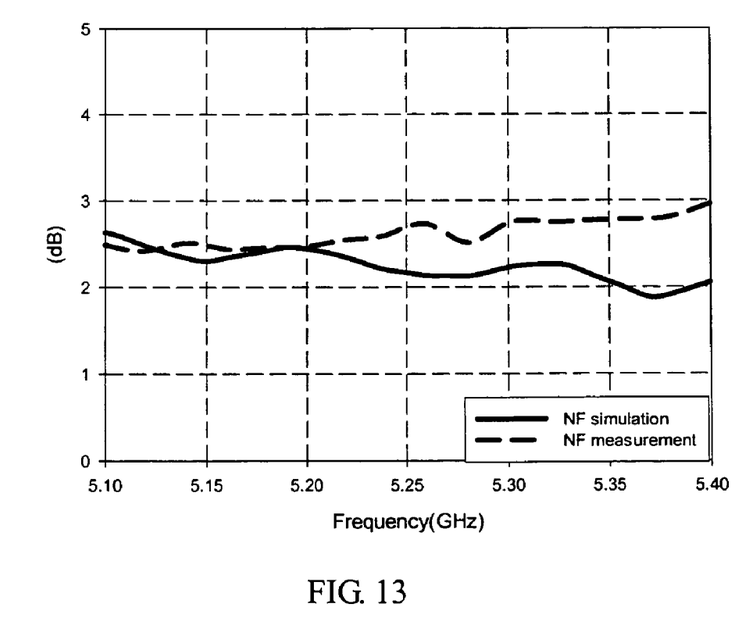
FIG. 13 shows the simulated and measured noise figure of the second passband of the dual-band active filter according to the second embodiment of the present invention.

Now referring to FIG. 12 and FIG. 13, they show the simulated and measured noise figure performance of the dual-band active filter according to the second embodiment of the present invention. The measured noise figures are 2.7 dB at the first passband from the 2.4 to 2.483 GHz and 2.9 dB at the second passband from the 5.15 to 5.35 GHz, indicating that the dual-band active filter according to the present invention also has low noise figure, suitable for the application of low noise amplifier.

According to the preferred embodiment of the present invention, the advantage of the dual-band active filter can be implemented in a single-chip form by CMOS, HBT and pHEMT foundry process to have positive gain and dual-band band-pass filter performance in the microwave to millimeter-wave range.

Another advantage of the dual-band active filter is that the filter response of the bandpass amplifier can be precisely predicted.

Another advantage of the bandpass amplifier is that the transmission zero frequency is located at the controlled frequency to enhance the stop-band attenuation of the bandpass amplifier.

Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:

1. A dual-band active filter having filtering response and positive gain, comprising:
    an input match unit for gain match of the dual-band active filter and for having a band-pass filter response;
    a first gain stage electrically connected to the first input match unit for providing the flat gain of the dual-band active filter;
    a first inter-stage unit electrically connected to the first gain stage for having a band-stop filter response;
    a second gain stage electrically connected to the first inter stage unit for providing the flat gain of the dual-band active filter; and
    an output unit electrically connected to the second gain stage for matching the dual-band active filter and for having a low-pass filtering response.

2. A dual-band active filter as claimed in claim 1, wherein the input match unit is constructed from a first L network, a second L network and a third L network comprising the inductors and capacitors, resulting for gain match of the dual-band active filter and for having a high-pass and another band-pass response.

3. A dual-band active filter as claimed in claim 2, wherein the inductance of the inductors and the capacitance of the capacitors in the first L network are determined by the cutoff frequency of the high-pass response and the first image impedances of the first L network.

4. A amplifier as claimed in claim 3, wherein the first image impedance of the first L network matches the input and output impedance of the first L network to minimize the pass-band gain ripple of dual-band active filter.

5. A dual-band active filter as claimed in claim 2, wherein the inductance of the inductors and the capacitance of the capacitors in the second L network are determined by the cutoff frequency of the first high-pass filter response, and the second image impedances of the second L network.

6. A dual-band active filter as claimed in claim 5, wherein the second image impedance of the first L network matches the input and output impedance of the second L network to match the gain of the dual-band active filter.

7. A dual-band active filter as claimed in claim 2, wherein the first L network minimizes the gain ripple effect caused by the impedance variation of the second L network.

8. A dual-band active filter as claimed in claim 1, wherein the third L network comprising the inductors and capacitors has the band-pass filter response.

9. A dual-band active filter as claimed in claim 8, wherein the inductance of the inductors and the capacitance of the capacitors in the third L network are determined by the cutoff frequency of the band-pass filter response, and the third image impedances of the third L network.

10. A dual-band active filter as claimed in claim 9, wherein the third image impedance of the third L network matches the input and output impedance of the third L network and drives the first gain stage of the dual-band active filter.

11. A dual-band active filter as claimed in claim 1, wherein the output match unit is constructed from a fourth L network and a fifth L network comprising the inductors and capacitors, resulting for gain match of the dual-band active filter and for having a low-pass filter response.

12. A dual-band active filter as claimed in claim 11, wherein the inductance of the inductors and the capacitance of the capacitors in the fourth L network are determined by the cutoff frequency of the low-pass filter response, and the fourth image impedances of the fourth L network.

13. A dual-band active filter as claimed in claim 12, wherein the fourth image impedances of the fourth L network match the input and output impedances of the fourth L network to match the second terminal of the dual-band active filter.

14. A dual-band active filter as claimed in claim 11, wherein the inductance of the inductors and the capacitance of the capacitors in the fifth L network are determined by the cutoff frequency of the low-pass filter response, and the fifth image impedances of the fifth L network.

15. A dual-band active filter as claimed in claim 14, wherein the fifth image impedances of the fifth L network match the input and output impedances of the fifth L network to minimize the pass-band gain ripple of the dual-band active filter.

16. A dual-band active filter as claimed in claim 11, wherein the fourth L network minimizes the gain ripple effect caused by the impedance variation of the fifth L network.

17. A dual-band active filter as claimed in claim 1, wherein the first inter-stage unit is a network comprising the inductors and capacitors, resulting for matching the first gain stage and the second stage and for having a band-stop filter response.

18. A dual-band active filter as claimed in claim 17, wherein the inductance of the inductors and the capacitance of the capacitors in the first inter-stage unit are determined by the cutoff frequency of the band-stop filter response, and the sixth image impedances of the network in the first inter-stage unit.

19. A dual-band active filter as claimed in claim 18, wherein the sixth image impedances of the first inter-stage unit match the input and output impedances of the first inter-stage unit and drives the second gain stage of the dual-band active filter.

* * * * *